(12) United States Patent
Johnson et al.

(10) Patent No.: US 9,156,553 B1
(45) Date of Patent: Oct. 13, 2015

(54) AIRCRAFT MISSION EQUIPMENT HAVING AN INTEGRATED AIR CASTER HANDLING SYSTEM

(75) Inventors: Stephen T. Johnson, Kent, WA (US);
Brad Lee Kirkwood, Kent, WA (US);
Andrea C. Saunders, Seattle, WA (US);
Kim Marie Larson, Seattle, WA (US);
John Michael Costello, Kent, WA (US);
Scott W. Lea, Renton, WA (US)

(73) Assignee: The Boeing Company, Chicago, IL (US)

( * ) Notice: Subject to any disclaimer, the term of this patent is extended or adjusted under 35 U.S.C. 154(b) by 734 days.

(21) Appl. No.: 13/309,613

(22) Filed: Dec. 2, 2011

(51) Int. Cl.
*B64D 9/00* (2006.01)

(52) U.S. Cl.
CPC ............ *B64D 9/00* (2013.01); *B64D 2009/006* (2013.01)

(58) Field of Classification Search
CPC .............................. B64D 9/00; B64D 2009/006
USPC .............. 244/118.1, 118.2, 136, 137.1, 137.3
See application file for complete search history.

(56) References Cited

U.S. PATENT DOCUMENTS

| | | | | |
|---|---|---|---|---|
| 2,918,183 | A * | 12/1959 | Petersen et al. ............... | 414/676 |
| 3,307,080 | A * | 2/1967 | Cody ............................. | 361/726 |
| 3,513,934 | A * | 5/1970 | Crowley ....................... | 180/124 |
| 3,756,342 | A * | 9/1973 | Burdick ......................... | 180/124 |
| 3,780,823 | A * | 12/1973 | Michaud et al. .............. | 180/121 |
| 3,796,279 | A * | 3/1974 | Burdick et al. ............... | 180/124 |
| 4,089,040 | A * | 5/1978 | Paulsen ......................... | 361/691 |
| 4,153,225 | A * | 5/1979 | Paulsen ...................... | 244/118.1 |
| 4,155,421 | A * | 5/1979 | Johnson et al. ............... | 180/125 |
| 4,240,773 | A * | 12/1980 | Terry ............................... | 410/47 |
| 4,301,984 | A * | 11/1981 | Olason ......................... | 244/137.1 |
| 4,441,571 | A * | 4/1984 | Wood ............................ | 180/128 |
| 4,815,926 | A * | 3/1989 | Chaffee et al. ................. | 414/676 |
| 5,456,556 | A | 10/1995 | Petrovic | |
| 6,963,490 | B2 * | 11/2005 | McClary ....................... | 361/704 |
| 7,168,369 | B2 | 1/2007 | Bocquet et al. | |
| 7,426,974 | B1 * | 9/2008 | Yeghiayan et al. ........... | 180/125 |
| 7,913,950 | B2 * | 3/2011 | Huber ......................... | 244/118.1 |
| 2009/0115297 | A1 * | 5/2009 | Bulow et al. .................. | 312/244 |
| 2009/0178821 | A1 * | 7/2009 | Zavidniak et al. .............. | 174/51 |
| 2009/0195135 | A1 * | 8/2009 | Nemoz et al. ................. | 312/408 |
| 2012/0170227 | A1 * | 7/2012 | Bayliss et al. ................ | 361/727 |

OTHER PUBLICATIONS

AeroGo, Air Caster Principle (2008).
AeroGo, Aero-Caster Selection Guide (2010).
AeroGo, Innovative Load Moving Solutions, T-Slot Floor Move (2002).
www.airsled.com, Web Pages for Appliance and Vending Machine Movers and for Custom Industrial and Specialty Lifting Solutions.
AeroGo, Operating and Maintenance Instructions, Aero-Pallet(TM) Systems, Bulletin #OM-Air Pallet 031607 (2007).

* cited by examiner

*Primary Examiner* — Tien Dinh
*Assistant Examiner* — Steven Hawk
(74) *Attorney, Agent, or Firm* — Ostrager Chong Flaherty & Broitman P.C.

(57) ABSTRACT

Aircraft mission equipment (e.g., an electrical equipment cabinet) comprising a base plate equipped on a bottom with a plurality of air casters that provide flotation mobility. When the equipment is being loaded in or unloaded from an aircraft, the actuated air casters provide a plurality of air cushions. The total lift force produced by the air cushions is sufficient to float the equipment above and out of contact with the floor, thereby improving ease of handling and reducing point loads on the floor structure. Portions of the air distribution system that provides pressurized air to the air casters on the bottom of the base plate are structurally integrated into the base plate of the mission equipment.

14 Claims, 5 Drawing Sheets

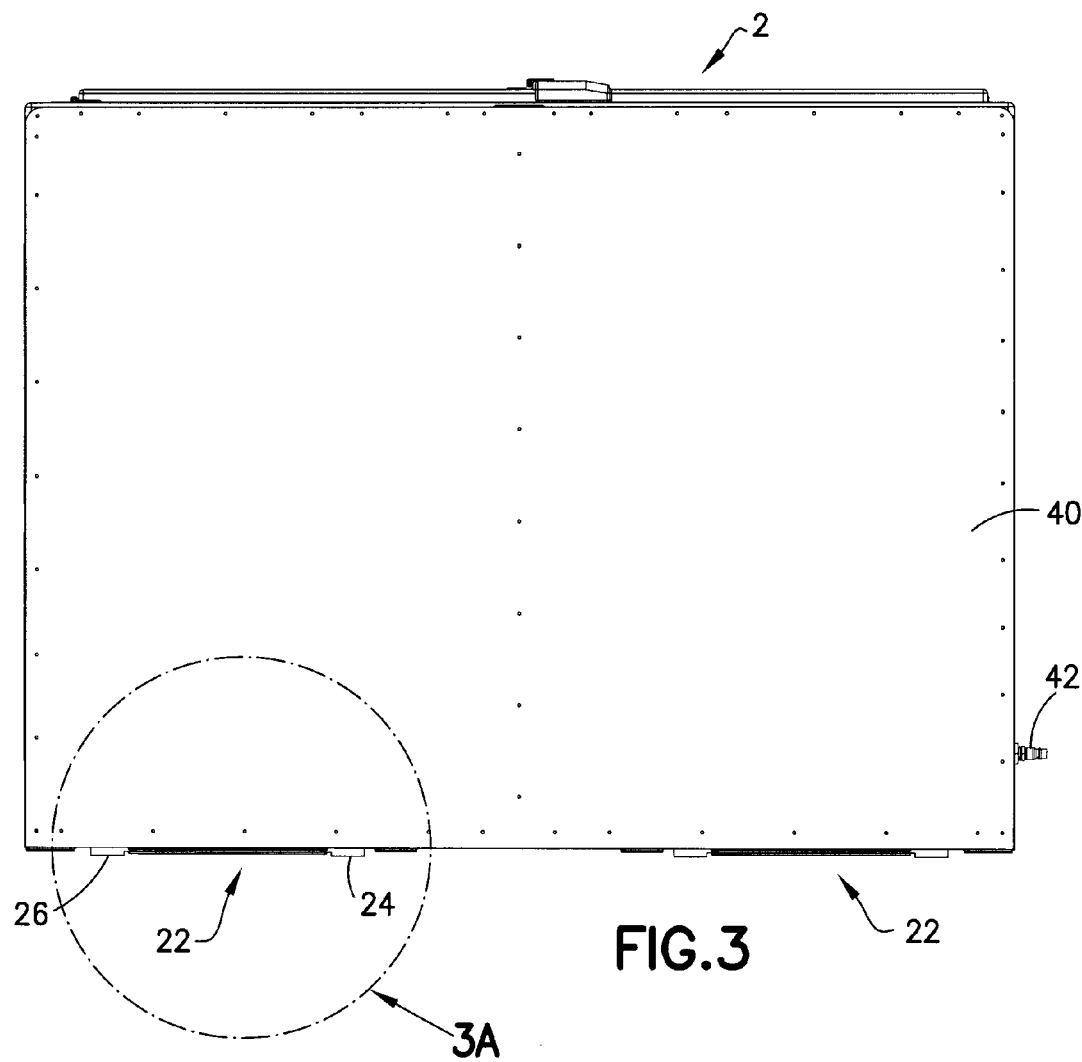
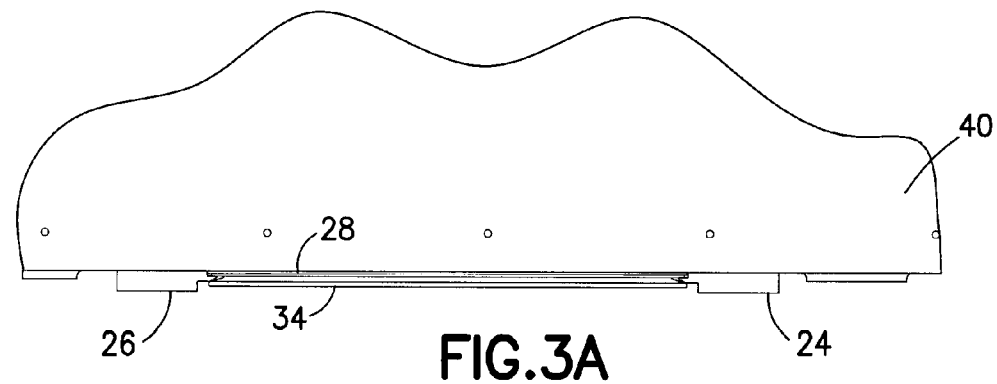

AIRCRAFT MISSION EQUIPMENT HAVING AN INTEGRATED AIR CASTER HANDLING SYSTEM

BACKGROUND

The subject matter of this disclosure generally relates to systems and methods for moving heavy objects using air cushions. In particular, this disclosure relates to systems for loading and unloading aircraft mission equipment using an air caster handling system.

Many components of an aircraft mission equipment inventory, such as electrical equipment cabinets (EECs), can be bulky and large. In the aircraft interior, there are space limitations that restrict the movement of personnel and equipment. This space limitation becomes more of an issue as each EEC gets installed in the aircraft. In many cases, the EEC is so large that, in order to remove or install it, other onboard equipment needs to be moved.

In the past, each EEC was rolled into an aircraft, positioned and then loaded with equipment. Because an EEC weighs approximately 200 pounds empty, the cabinet casters produced high point loads on the floor. Thus the loading process required additional support over the floor panels to prevent damage. In some cases an independent pallet was used underneath the EEC due to its weight. Use of an independent pallet requires substantial manipulation to move the EEC into place; often times this results in damage to the EEC, aircraft structure or electrical equipment, and/or injury to personnel manually loading the equipment.

In a known process, after an empty EEC has been loaded into the aircraft, the mission equipment is installed in the cabinet. Installing cabinet equipment includes retrieving it out of storage, locating the various subsystems in and securing them to the cabinet, attaching power and data cables, and functionally verifying that the equipment was installed correctly. If this installation is performed while the cabinet is in the aircraft, the latter must be out of service for the duration of the equipment installation process. Alternatively, the equipment can be installed while the cabinet is in a shop and before the aircraft has landed. After landing, the fully equipped and tested cabinet can be loaded into the aircraft, thereby reducing the aircraft's time on the ground.

Because different missions require different equipment onboard the aircraft, it would be beneficial to increase the mobility of the EECs and other equipment which need to be loaded or unloaded. Cabinet mobility decreases the complexity of rearranging the mission payloads in the aircraft and improves the ability to reconfigure aircraft mission equipment. This capability decreases the turn-around time to exchange the ECCs, which in turn increases the aircraft's flexibility. Most mission capability will be contained within removable EECs. If those EECs are easily movable on and off the aircraft, then an aircraft need carry only the equipment needed for a particular mission. After each mission, equipment not needed for the next mission can be removed and needed equipment can be loaded. The ability to easily remove unneeded mission equipment reduces aircraft weight, increases the available interior space and expands the overall capability of the aircraft.

It is known to use air casters (a.k.a. air bearings) to load and unload mission equipment. A cabinet can be fully outfitted with system hardware or equipment before being loaded onto the aircraft. The aircraft floor incurs only a minimal weight footprint due to the distributed load nature of the air casters, thereby reducing damage to the aircraft. Since the cabinet can be fully loaded or pre-staged before installation in the aircraft, the traditional long flow time needed to perform installation of mission system equipment can be eliminated, allowing the aircraft to rapidly return to service.

Current air caster systems for moving equipment on and off an aircraft are autonomous in nature and are removed after each handling operation. There is a need for improvements in air caster handling systems which enable an aircraft operator to easily remove, reconfigure and install mission equipment.

SUMMARY

The air caster handling systems disclosed herein address the above needs and attain other advantages. In accordance with embodiments disclosed hereinafter, electrical equipment cabinets for aircraft mission systems are designed to structurally integrate at least portions of the air caster handling system into the cabinet base for flotation mobility.

The idea of floating on air casters is not new, but integrating this capability into an electrical cabinet or on-board aircraft equipment without incurring weight penalties offers many opportunities. The equipment can carry a range of weight up to the air caster capacity and the center of gravity will change with each loading scenario. Understanding the loading conditions is necessary in order to maximize the advantage of an air caster handling system. This requires an understanding of effective operating pressure requirements, flow restrictions and safety issues.

One aspect of the improvements disclosed herein is aircraft mission equipment comprising: a base comprising a plurality of enclosures, each enclosure having inlet and outlet ports; a rack for supporting components, the rack being mounted to the base; and a plurality of air casters attached to the base, each air caster having an air inlet that is in fluid communication with the outlet port of a respective enclosure. In order to levitate the cabinet, the inlet port of each enclosure receives a respective flow of pressurized air via a bulkhead fitting mounted to the cabinet. The base comprises a base plate having structural features that form at least portions of the system for distributing air to the air casters.

Another aspect is aircraft mission equipment comprising: a base plate comprising a bottom portion having a plurality of openings and a plurality of chamber walls projecting upward from the bottom portion, each chamber wall having a respective opening while surrounding a respective opening in the bottom portion; a plurality of cover plates, each of the cover plates being attached to a respective chamber wall to form a respective pressure chamber; a rack for supporting components, the rack being mounted to the base plate; and a plurality of air casters attached to the bottom portion of the base plate, each air caster having an air inlet that is in fluid communication with a respective one of the plurality of openings in the bottom portion.

A further aspect is an equipment cabinet comprising a base plate, a rack on top of the base plate, a plurality of air casters attached to a bottom of the base plate, and a bulkhead fitting for receiving pressurized air from a source external to the cabinet, wherein the base plate has structural features that form at least portions of an air distribution system for guiding the flow of pressurized air from the bulkhead fitting to the air casters, the cabinet further comprising other elements of the air distribution system which are attached to the base plate.

Other aspects are disclosed and claimed below.

BRIEF DESCRIPTION OF THE DRAWINGS

FIG. 3 is a diagram showing a side view of the electrical equipment cabinet depicted in FIGS. 1 and 2. The air casters are shown in a deflated state.

FIG. 3A is a diagram showing a portion of FIG. 3 on a larger scale, the portion lying within circle 3A seen in FIG. 3.

Reference will hereinafter be made to the drawings in which similar elements in different drawings bear the same reference numerals.

DETAILED DESCRIPTION

For the purpose of illustration, various embodiments of aircraft mission equipment equipped with an air caster handling system will be described hereinafter. However, it should be appreciated that the teachings disclosed hereinafter have application in fields other than aviation.

Figure 1:
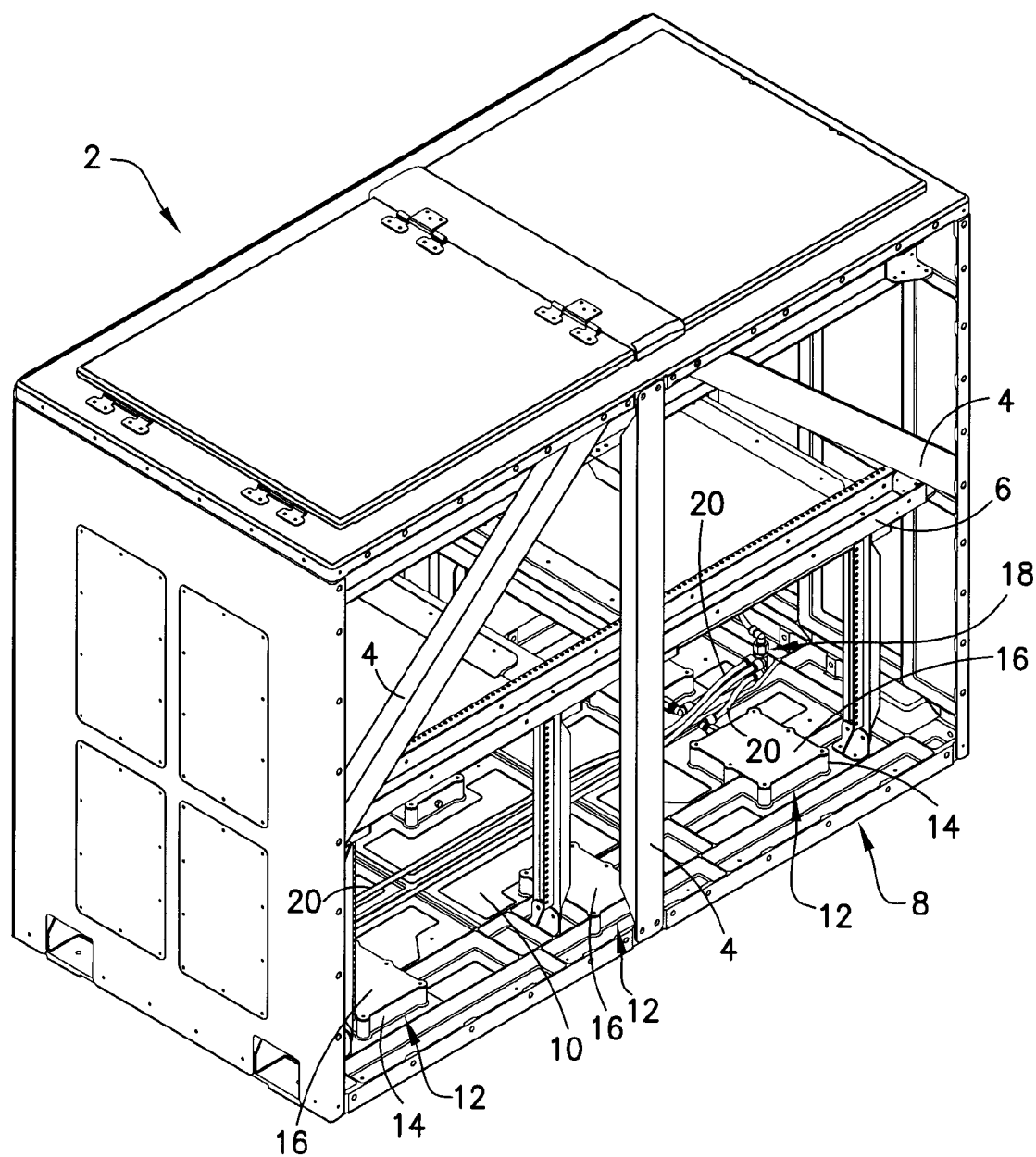
FIG. 1 is a diagram showing an isometric view of an unequipped electrical equipment cabinet incorporating an air caster handling system in accordance with one embodiment. A wall has been removed to expose the interior of the cabinet.
Figure 2:
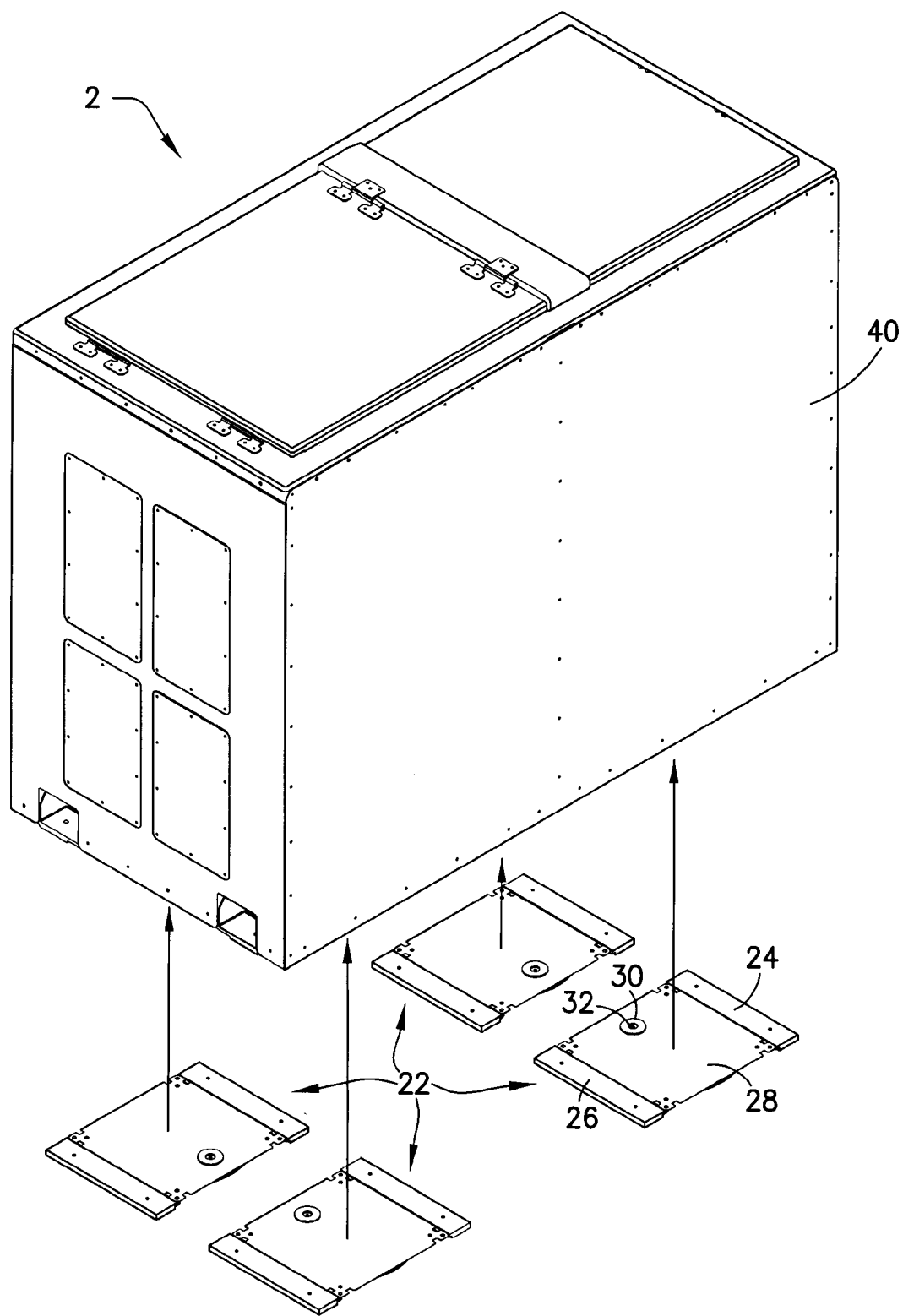
FIG. 2 is a diagram showing a partially exploded, isometric view of the electrical equipment cabinet with a plurality of air casters of the air caster handling system shown separated from the cabinet bottom, but with their mutual positional relationship maintained.

An electrical equipment cabinet 2 in accordance with one embodiment is shown in FIGS. 1 and 2. In FIG. 1, a wall has been removed to expose the interior of the cabinet 2. The cabinet 2 comprises a frame 4 attached to a base plate 8. The base plate 8 is made of machined aluminum or other suitable metallic alloy. A rack 6 is disposed inside the cabinet. Rack 6 comprises shelves supported by beams, which are in turn supported by legs, the lower ends of which are attached to base plate 8. The cabinet 2 is shown in FIG. 1 without electrical subsystems installed therein, so the rack 6 appears empty. The entire cabinet 2 is movable as a unit onto and off of an aircraft, even after all of its electrical subsystems have been fully installed.

Referring again to the embodiment seen in FIG. 1, the base plate assembly has six pressure chambers 12, only five of which are visible. (All six pressure chambers 12 can be seen in FIG. 4, which shows the base plate assembly in isolation.) The base plate 8 comprises a rectangular planar bottom portion 10 (see FIG. 5) having a plurality of air casters 22 fastened thereto. Since these air casters are underneath the cabinet, they are not visible in FIG. 1.

Figure 4:
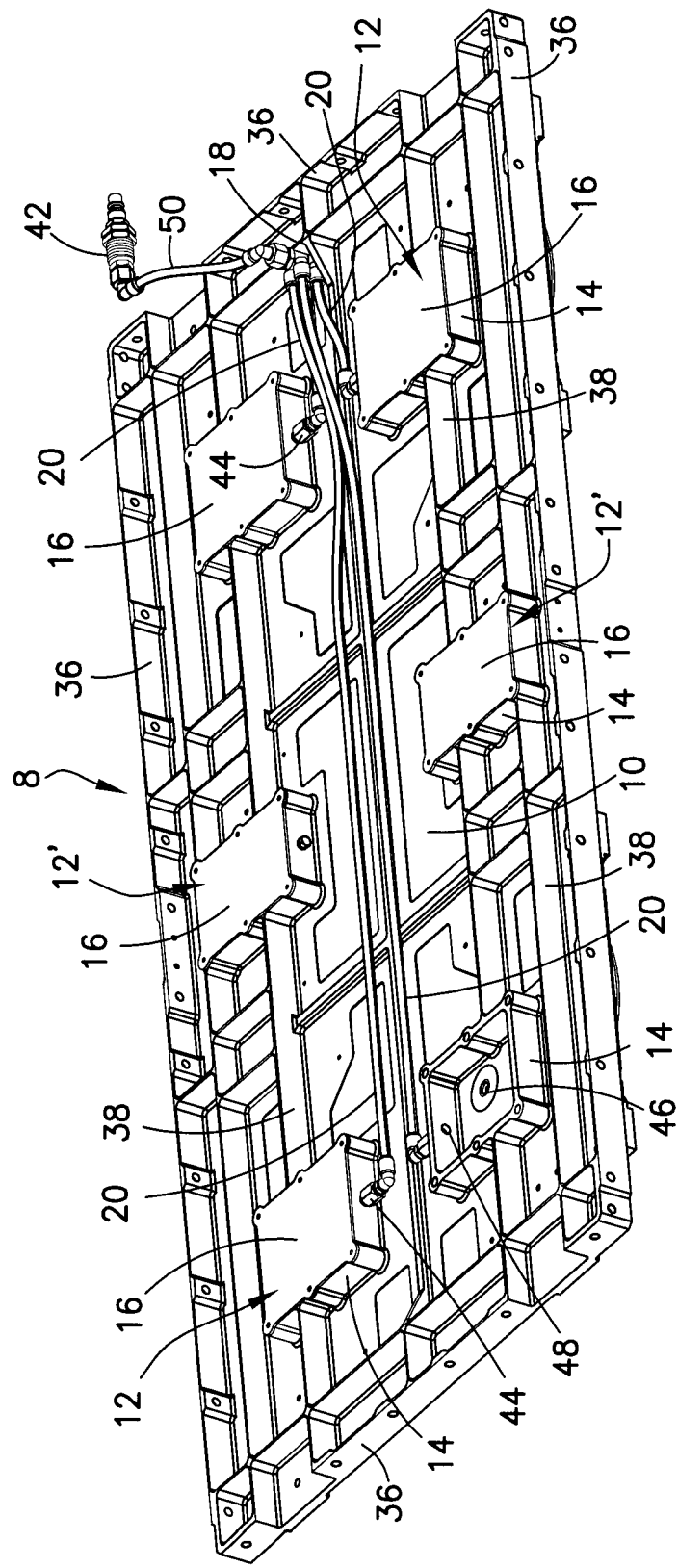
FIG. 4 is a diagram showing an isometric view from above of the base plate assembly incorporated in the cabinet depicted in FIGS. 1-3.
Figure 5:
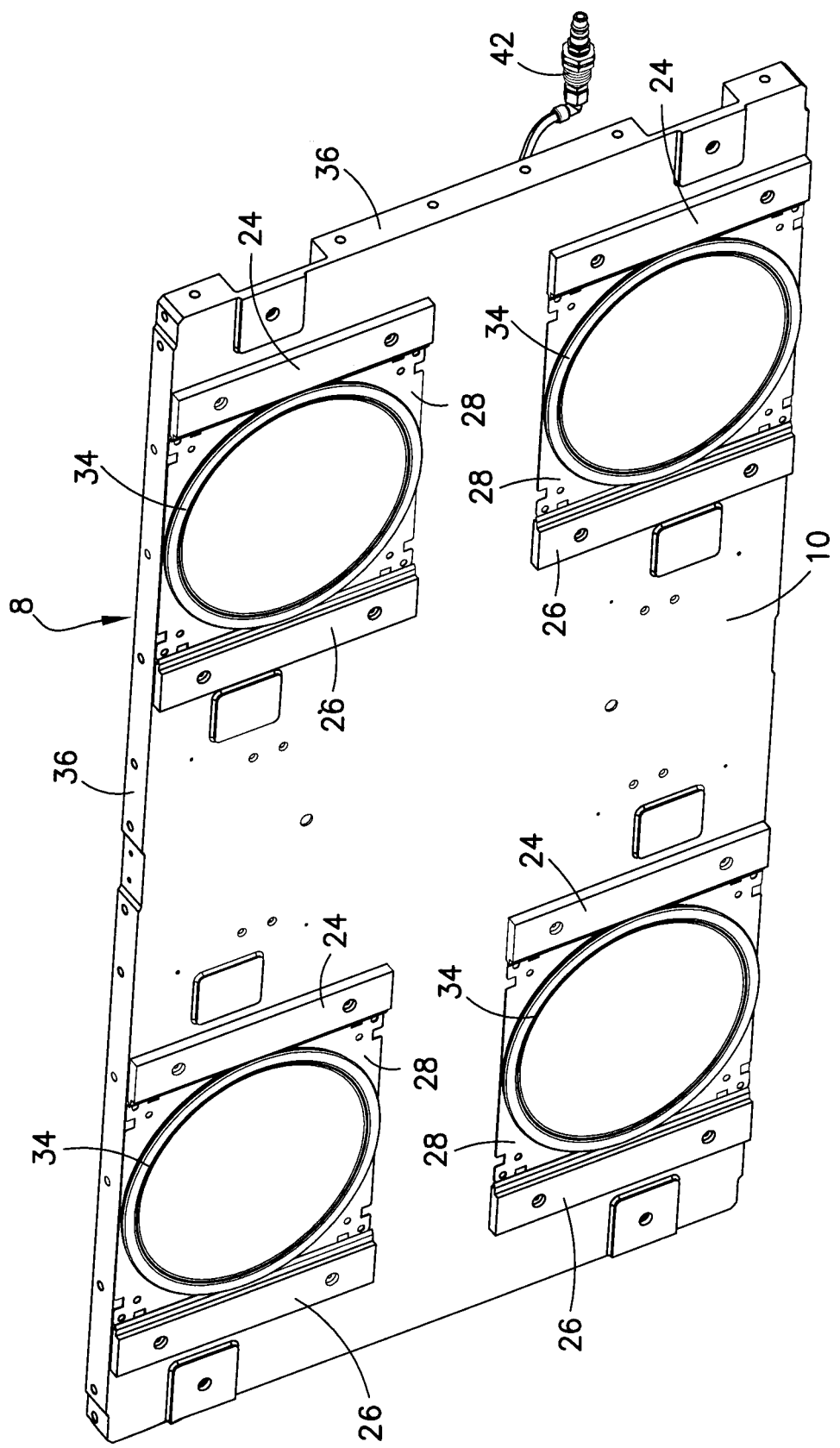
FIG. 5 is a diagram showing an isometric view from below of the base plate assembly depicted in FIG. 4.

As seen in FIGS. 2 and 5, the cabinet 2 has four air casters 22. As seen in FIGS. 1 and 4, the cabinet 2 has six pressure chambers 12. Each air caster 22 is directly below and in fluid communication with a respective pressure chamber 12. In the example depicted in FIG. 4, the two pairs of pressure chambers 12 at the ends of the cabinet are coupled to respective air casters below (not visible in FIG. 4), while the pair of pressure chambers 12' in the middle of the cabinet are not coupled to air casters. The number of air casters can be varied depending on the lifting capacity of each air caster, the weight of the cabinet when all electrical equipment has been installed, and the size and shape of the cabinet footprint. The pair of pressure chambers 12' in the middle of the base plate 8 (see FIG. 4) are available for respective coupling to two additional air casters, which can be easily fastened to the cabinet bottom 10.

As best seen in FIG. 4, each pressure chamber 12 comprises a chamber wall 14 of constant height that projects upward from the cabinet bottom 10 to form a cavity and a cover plate 16 attached to the top edge of chamber wall 14, which serves as a cover that encloses the cavity. In the depicted embodiment, the pressure chambers 12 have generally rectangular shapes, but other shapes can be used.

In FIG. 4, one of the cover plates 16 has been removed in order to show the internal structure of the uncovered pressure chamber 12 (seen in the lower left-hand corner of base plate 8 in FIG. 4). The portion of the cabinet bottom 10 disposed inside chamber wall 14 has an opening 46 which serves as an air outlet port. That air outlet port 46 is aligned with and coupled to the air inlet port of the air caster (not visible in FIG. 4) mounted directly underneath the pressure chamber. In addition, the chamber wall 14 has an opening 48 which serves as an air inlet port, which is coupled to the pressurized air distribution system.

As best seen in FIG. 4, the pressurized air distribution system comprises an air line manifold 18 having a single air inlet port and multiple air outlet ports, and a multiplicity of air lines 20, each air line 20 having one end connected to a respective air outlet port of the manifold 18. The other end of each air line 20 is connected to a respective flow restrictor assembly 44. The flow restrictor assembly prevents excessive air flow. In one implementation, the air lines 20 can be made of sections of lightweight nylon tubing connected by air line fittings (not shown) made of steel. Alternatively, the air line fittings can be made of plastic. Each flow restrictor assembly 44 is coupled to the air inlet port 46 of a respective pressure chamber 12. Because the middle pair of pressure chambers 12' are not being used in this example, they are not connected to the manifold 18 via air lines 20 and do not have flow restrictor assemblies 44 installed in their air inlet ports 48.

Still referring to FIG. 4, the air inlet port of air line manifold 18 is connected to a bulkhead fitting 42 by an air line 50. As seen in FIG. 3, the bulkhead fitting 42 projects through a wall of the cabinet 2. Bulkhead fitting 42 can be fixedly attached to either the cabinet frame or a cabinet wall supported by the cabinet frame in a manner such that the air inlet port of the bulkhead fitting 42 is disposed outside the cabinet and accessible for the connection of an air line from a source of pressurized air (not shown in the drawings). The bulkhead fitting 42 may incorporate a pressure regulator. When pressurized air is supplied to the bulkhead fitting 42, that pressurized air flows in sequence through air line 50, manifold 18, air lines 20, and flow restrictor assemblies 44 and fills the pressure chambers 12. The resulting increased air pressure inside the four pressure chambers 12 causes air to flow out the respective air outlet ports 46 and into the air casters in fluid communication therewith, thereby lifting the cabinet off the ground and enabling it to float on cushions of air in a well-known manner.

In accordance with the embodiment shown in FIGS. 1-5, portions of the pressurized air distribution system (namely, chamber walls 14 and openings 46 and 48) are formed in the base plate by machining. In accordance with a further alternative embodiment, the air lines 20 could be replaced by channels formed in the base plate, one channel for each air line, each channel being enclosed by a respective channel cover and terminating at the air inlet port of a respective pressure chamber. In addition, the air line manifold 16 could be replaced by a manifold channel that is in fluid communication with the aforementioned air line channels, which manifold channel is again enclosed by a manifold cover. The air line and manifold channels can also be formed by machining the base plate 8.

The air casters can be any one of a multitude of commercially available air casters. FIGS. 2 and 5 show respective views of exemplary air casters 22 from above and below. As shown in FIG. 5, each air caster 22 comprises a pair of frame members 24 and 26 (made, e.g., of Delrin) fastened to the bottom of base plate 8, a backing plate 28 (made, e.g., of metal or Neoprene) which slides into and is supported by receiving slots formed in frame members 24 and 26, and a perforated bladder 34 attached to the backing plate 28. During insertion, the sliding backing plate 28 is stopped by a dowel at the correct location so that locks on the frames can lock the backing plate in a well-known manner. A failed air caster can be easily replaced by unlocking the backing plate of the failed air caster, sliding the failed air caster out of the frame, and inserting a replacement.

When an air caster is correctly positioned in the frame, an air inlet port 32 formed in the backing plate 28 (see FIG. 2) will be underneath and aligned with the air outlet port of an associated pressure chamber. That air inlet port 32 is in turn aligned and in fluid communication with an opening (not shown) in the air caster bladder (item 34 in FIG. 3A). Because of the high pressure inside the pressure chamber, air flows from the pressure chamber into the plenum chamber formed by the inflated bladder. To prevent air leakage, the opening 30 in each backing plate 28 is provided with a respective ring-shaped seal 32 (made, e.g., of Neoprene), which encircles the space disposed between the air outlet port (item 46 in FIG. 4) formed in the cabinet bottom 10 and opening 30 in the backing plate 28.

As seen in FIG. 3A, the frame members 24, 26 act as landing pads when bladder 34 is deflated. These pads protect the air caster bladders from being crushed when the load is at rest. When pressurized air is supplied to the air casters, the bladders 34 inflate, creating a seal against the floor surface and raising the cabinet so that frame members 24, 26 no longer touch the floor. The bladder has small holes all around its bottom so it will look like a pancake when it is inflated, but if the maximum amount of pressure the bladder can withstand is applied, the bladder will be a torus surrounding a so-called plenum chamber formed between the backing plate 28 and the floor. When the air pressure within the plenum chamber is sufficient to offset the cabinet's weight, air evenly escapes between the flexible torus-shaped bladder and the floor. When this happens, the cabinet is floating on a plurality of thin, nearly frictionless cushions of air. Reduced friction and omni-directional movement allow personnel to precisely place and align the cabinet with and secured to seat tracks on the floor of the aircraft in a limited workspace.

A typical electrical equipment cabinet for an aircraft mission weighs up to 1,200 pounds with all of its equipment installed, but the air casters allow the cabinet to float over the floor with little point load. Instead the load is distributed over a larger area.

In the embodiment depicted in FIGS. 1-5, the base plate 8 is made by machining a precursor plate of metal alloy. In addition to forming the chamber walls 14, peripheral vertical walls 36 and interior vertical walls or ribs 38 are formed. The ribs 38 interconnect the chamber walls to each other and to the peripheral walls. All of these walls have the same height, which equals the thickness of the precursor plate. All of these features provide structural reinforcement to the base plate 8 as it bears the weight of the cabinet.

In accordance with a further alternative embodiment, the base plate could be formed by sintering in a mold that is shaped to form a plurality of pressure chambers, each chamber having an air inlet port and an air outlet port. This would allow the ceiling of the enclosure to be structurally integrated with the chamber wall (i.e., cover plates are not used), which chamber wall is in turn be structurally integrated with the bottom portion of the base plate.

Alternatively, features 14, 36 and 38 could be welded or fastened to a thinner base plate without machining, although this would add weight to the cabinet.

In accordance with the embodiments disclosed above, the base plate could be fabricated with structural features that form parts of the pressure chambers, parts of the air lines or a part of the manifold, all enclosed by the attachment of cover plates. Alternatively, the walls of the pressure chambers, air lines and manifold could be structurally integrated with the cover plates instead of with the base plate. For example, an inverted pan-shaped pressure chamber part (I.e., ceiling with wall along its perimeter, the wall having an air inlet port formed therein) could be fastened to a flat base plate, with a pressure chamber air inlet port formed in the base plate in fluid communication with the air outlet port formed in the attached inverted pressure chamber part.

Optionally, the precursor could be formed by sintering, casting or forging and then machined to a desired shape.

While apparatus has been described with reference to various embodiments, it will be understood by those skilled in the art that various changes may be made and equivalents may be substituted for elements thereof. In addition, many modifications may be made to adapt a particular situation to the teachings without departing from the essential scope thereof. Therefore it is intended that the claims not be limited to the particular embodiments disclosed.

The invention claimed is:

1. Aircraft mission equipment comprising:
a base comprising a plurality of pressure chambers, each pressure chamber having first and second ports;
an air manifold having a first port and a plurality of second ports;
a plurality of flow restrictors in fluid communication with said first ports of respective pressure chambers of said plurality of pressure chambers;
a plurality of air hoses, each air hose connecting a respective second port of said air manifold to a respective flow restrictor;
a rack for supporting components, said rack being mounted to said base; and
a plurality of air casters attached to said base, each air caster having a port that is in fluid communication and aligned with said second port of a respective one of said plurality of pressure chambers,
wherein said plurality of flow restrictors, said plurality of pressure chambers and said plurality of air casters are arranged so that compressed air supplied by said air manifold and said plurality of air hoses will flow first through said plurality of flow restrictors, then into said plurality of pressure chambers and then into said air casters.

2. The aircraft mission equipment as recited in claim 1, wherein said base comprises:
a base plate comprising a bottom portion surrounded by a wall that forms an open chamber; and
a cover plate attached to said wall for closing said open chamber,
wherein said closed chamber forms one of said pressure chambers.

3. The aircraft mission equipment as recited in claim 2, wherein said first port of said one pressure chamber is an opening in said wall, and said second port of said first pressure chamber is an opening in said bottom portion of said base plate.

4. The aircraft mission equipment as recited in claim 1, wherein each air caster comprises:
   first and second frame members attached to said base;
   a backing plate supported by said first and second frame members; and
   a bladder attached to said backing plate and in fluid communication with said port of said air caster,
   wherein said first and second frame members act as landing pads when said bladder is deflated.

5. The aircraft mission equipment as recited in claim 1, further comprising a plurality of ring-shaped seals, each ring-shaped seal encircling a space disposed between said second port of a respective pressure chamber and said port of a respective air caster.

6. The aircraft mission equipment as recited in claim 1, wherein said components are electrical subsystems.

7. Aircraft mission equipment comprising:
   a base plate comprising a bottom portion having a plurality of openings and a plurality of chamber walls projecting upward from said bottom portion, each chamber wall having a respective opening while surrounding a respective opening in said bottom portion;
   a plurality of cover plates, each of said cover plates being attached to a respective chamber wall to form a respective pressure chamber;
   an air manifold having a first port and a plurality of second ports;
   a plurality of flow restrictors in fluid communication with said openings in said respective chamber walls; and
   a plurality of air hoses, each air hose connecting a respective second port of said air manifold to a respective flow restrictor;
   a rack for supporting components, said rack being mounted to said base plate; and
   a plurality of air casters attached to said bottom portion of said base plate, each air caster having a port that is in fluid communication and aligned with a respective one of said plurality of openings in said bottom portion,
   wherein said plurality of flow restrictors, a plurality of said pressure chambers and said plurality of air casters are arranged so that compressed air supplied by said air manifold and said plurality of air hoses will flow first through said plurality of flow restrictors, then into said plurality of pressure chambers and then into said air casters.

8. The aircraft mission equipment as recited in claim 7, wherein each air caster comprises:
   first and second frame members attached to said bottom portion of said base plate;
   a backing plate supported by said first and second frame members; and
   a bladder attached to said backing plate and in fluid communication with said port of said air caster,
   wherein said first and second frame members act as landing pads when said bladder is deflated.

9. The aircraft mission equipment as recited in claim 7, further comprising a plurality of ring-shaped seals, each ring-shaped seal encircling a space disposed between a respective one of said openings in said bottom portion of said base plate and said port of a respective one of said air casters.

10. The aircraft mission equipment as recited in claim 7, wherein said components are electrical subsystems.

11. The aircraft mission equipment as recited in claim 1, wherein at least one pressure chamber of said plurality of pressure chambers comprises top and bottom plates and a closed chamber wall having a constant height, an uppermost portion of said chamber wall being connected or attached to said top plate and a lowermost portion of said chamber wall being connected or attached to said bottom plate, said first port of said at least one pressure chamber being formed in said chamber wall, and said second port of said at least one pressure chamber being formed in said bottom plate.

12. The aircraft mission equipment as recited in claim 11, wherein said bottom plate is made of metallic alloy and said closed chamber wall is integrally formed with said lowermost portion.

13. The aircraft mission equipment as recited in claim 11, wherein said constant height of said closed chamber wall is greater than a diameter of said first port of said at least one pressure chamber and a length of said closed chamber wall is greater than said constant height of said closed chamber wall.

14. The aircraft mission equipment as recited in claim 7, wherein said base plate is made of metallic alloy and said chamber walls are integrally formed with said bottom portion.

* * * * *